POWER TRANSISTORS

Filed Nov. 29, 1952

INVENTOR.
Jacques I. Pankove
BY J. L. Whittaker
ATTORNEY

United States Patent Office 2,754,455

Patented July 10, 1956

2,754,455

POWER TRANSISTORS

Jacques I. Pankove, Penns Neck, N. J., assignor to Radio Corporation of America, a corporation of Delaware Application November 29, 1952, Serial No. 323,219

18 Claims. (Cl. 317—234)

This invention pertains to semiconductor devices and particularly to P-N junction type semiconductor devices, such as transistors, for power applications.

A typical P-N junction type semiconductor device, such as a transistor, comprises a body of semiconductor material having zones of N-type and P-type conductivity. These zones are separated by a rectifying barrier which has high resistance to electrical charge flow in one direction and low resistance to such flow in the reverse direction. These devices operate by means of the passage of electrical charges, that is, electrons or holes (electron deficiencies in the crystal lattice) from one region or zone to the next. As happens in conventional electronic devices, this passage, or flow, of electrical charges in semiconductor devices, such as transistors, produces heat which should be removed for proper operation. The problem of heat dissipation is particularly important in the operation of transistors which handle considerable amounts of power. Heretofore, one solution of the problem of heat dissipation has been to immerse the device in an oil bath. However, such an arrangement is comparatively bulky, difficult to handle, and not completely safe since, in case the unit should break during operation, there is danger of fire from the hot oil.

Accordingly, an important object of this invention is to provide an improved semiconductor device.

Another object is to provide an improved semiconductor device suitable for high power operation.

Still another object is to provide an improved P-N junction type semiconductor device having good heat dissipation characteristics.

A further object is to provide an improved transistor having forced cooling means for improving high power operation.

Another object is to provide a transistor having improved coaxial configuration and cooling means for improved high power operation.

In general, the purposes and objects of this invention are accomplished by the provision of heat radiating means, for example a copper plate or plates, mounted in contact with the transistor and preferably in close heat transfer relationship with one or more of the P-N junctions therein. In addition, forced cooling means, such as pipes or tubes adapted to receive a circulating fluid (liquid or gas), are provided in conjunction with the plate or plates. In another aspect of the invention, the fluid circulating pipes or tubes are mounted in direct contact with portions of the transistor without the aid of copper radiating fins or plates.

In one embodiment of the invention, the semiconductor device is in cylindrical form and the P-N junctions associated therewith are coaxial with the body and extend the length of the body.

The principles of the invention are described with reference to the drawings wherein.

Similar elements are designated by the same reference numerals throughout the drawings.

Figures 1, 2, 3, 4, 5, 6, 7:
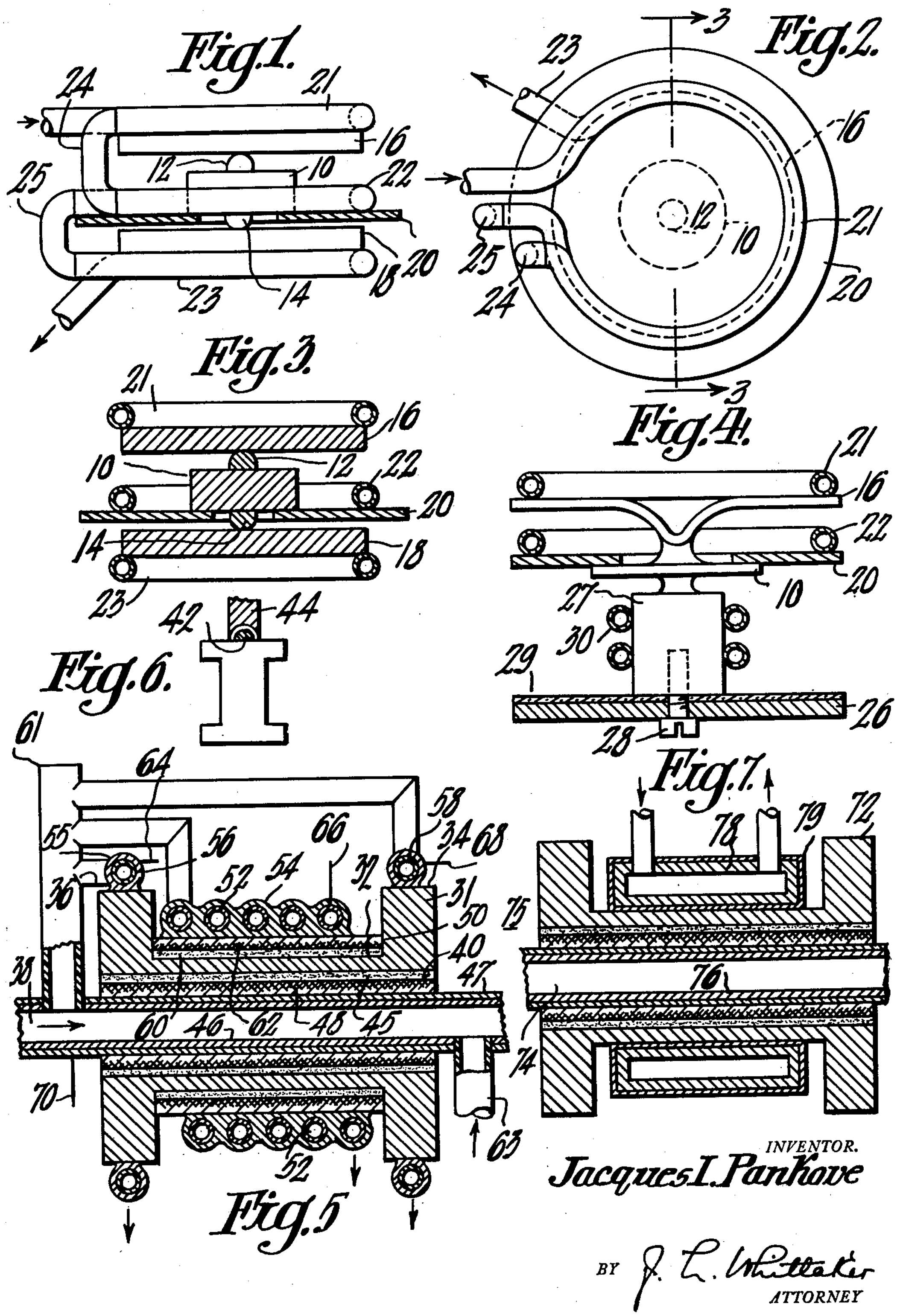
Fig. 1 is an elevational view of a transistor embodying the principles of the invention.
Fig. 2 is a plan view of the transistor shown in Fig. 1.
Fig. 3 is a sectional view along the line 3—3 in Fig. 2.
Fig. 4 is a sectional elevational view of a modification of the device shown in Figs. 1, 2 and 3.
Fig. 5 is an elevational, sectional view of another embodiment of the invention.
Fig. 6 is an elevational view of the device shown in Fig. 4 at an early stage in its preparaton; and, Fig. 7 is an elevational view of a modification of the device shown in Fig. 5.

The principles of this invention may be applied to the type of transistor construction shown and described in a copending application of Charles W. Mueller, Serial No. 316,171, filed October 22, 1952, and assigned to the assignee of this application. One form of device shown in the Mueller application and illustrated, generally, in Figs. 1, 2, and 3 comprises a body of semiconductor material 10, for example, germanium or silicon, of N-type or P-type conductivity, having P-N junction formed in opposite surfaces thereof, said junctions providing emitter and collector elements including portions 12 and 14 projecting above the surfaces of the body 10. Metal disks 16 and 18, for example of copper, utilized as heat dissipators or radiators are connected to the projecting portions 12 and 14 respectively of the junctions and a copper annulus 20 is bonded to the main body of the device.

Improved heat dissipation is achieved by providing forced cooling means in conjunction with the radiator plates 16, 18 and 20. One such forced cooling arrangement comprises a plurality of hollow metal tubes adapted to receive a circulating cooling agent and mounted in contact with each radiator plate and mechanically serially connected with each other. Of course, the tubes may also be connected separately in parallel with the fluid source. One tube 21 is mounted, as by soldering, on the plate 16 around substantially the entire periphery thereof. Another tube 22 is similarly mounted on the plate 20 which is bonded to the main body of the device. A third tube 23 is similarly mounted on the plate 18 which is bonded to the junction portion 14. One end of the tube 21 is connected to a source (not shown) of a cooling agent to be directed through the tubes and the other end is joined by means of an insulating pipe 24 to the end of the tube 22 connected to the radiator plate 20. The other end of the tube 22 is similarly connected through a piece of insulating hose or pipe 25 with one end of the tube 23, the other end of which returns to the source of the circulating cooling medium. Any suitable insulating cooling fluid such as distilled water may be used and if desired a gas may be used as the circulating cooling agent.

A modification of the invention is shown in Fig. 4 wherein, one of the plates 16, 18 or 20, for example 18, is replaced by a generally cylindrical metallic body 27 having attached thereon a tube 30 for circulating the cooling fluid. The cylinder 27 also has an internal threaded portion by means of which the completed transistor may be fastened to a chassis 26 or some similar device by means of a bolt 28. If the transistor is to be electrically insulated from the chassis, a thin layer of insulating material 29 may be interposed between the cylinder and the body, and the bolt securing the transistor may be made of insulating material such as plastic.

In either embodiment of the invention described above, economy may be achieved by attaching a fluid circulating pipe to only one of the three metallic bodies, for example to cylinder 27 in Fig. 4 or to plate 18 in Fig. 3.

Another embodiment of the invention is shown in Fig. 5 and comprises a body of semiconductor material, e. g. germanium, for example of N-type conductivity shaped in the form of a spool 31 having a reduced central portion or recess 32 and end portions 34 and 36 of relatively larger diameters. The reduced portion 32 may be formed from a solid cylinder of germanium by means of an abrasive grinding operation or by suitably masking and etching the germanium cylinder. If grinding is employed a subsequent etching operation is generally employed. If desired, the reduced portion may be formed later in the process of making the transistor. The germanium cylinder is also provided with an axial opening 38 of circular cross section extending along its length and an annular P-N junction 40 is formed beneath the inner surface of the cylinder defining the central longitudinal opening 38 and coaxial with the opening. The opening 38 and the P-N junction 40 associated therewith may conveniently be formed in a single operation.

To carry out this operation, referring to Fig. 6, a quantity 42 of junction-forming impurity material is placed substantially in the center of one end of the germanium body 31 and a solid metal rod 44 is applied thereto. The rod 44 is heated by means of a soldering iron or high frequency coil or the like and as the impurity material 42 is heated by the rod, it becomes molten and dissolves some of the germanium. Pressure applied to the rod 44 forces the impurity material through the germanium ahead of the rod whereby the axial opening is formed. In addition, as the impurity material is forced through the germanium body 31, it alloys with the germanium to form the P-N junction 40 including an annular rectifying barrier 45 and an annular layer 48 of material of P-type conductivity. Alternatively, the hole drilling operation may be performed by filling a hollow metal tube having a small opening at one end with the desired impurity substance. The tube is applied to the surface of the germanium and heated, whereby the impurity substance becomes molten and flows out of the open end. Pressure applied to the rod and the action of the molten impurity material achieve the drilling and alloying action described above.

With a spool of N-type germanium, any one of indium, gallium, aluminum, zinc, or boron may be employed as the impurity substance. Since gallium is a liquid at room temperature, the drilling and alloying operations and subsequent operations such as etching may be more conveniently performed. However, indium, aluminum and zinc which are solids at room temperature may also be employed. Elements such as boron which melt at a temperature higher than the melting point of germanium may be used as an impurity if they are first dissolved into a liquid carrier which is either neutral (lead or tin) or of the same impurity character. With a spool of P-type germanium, any one of arsenic, antimony, bismuth or phosphorus may be employed as the impurity substance. After the axial opening 31 and the P-N junction 40 have been formed, the heating rod 44 is removed and the surface of the junction region lining the opening is etched in conventional fashion by means of a conventional etching solution, for example a mixture of hydrofluoric acid, nitric acid and copper nitrate. Next a hollow metal tube 46 of copper or nickel or the like is coated with a layer 47 of tin or indium or other low melting point soldering material and is inserted into the opening 38. The tube 46 is heated sufficiently, for example by passing a current through the tube, to melt the coating of tin or indium and bond the tube to the surface material associated with the junction 40. The tube 46 then comprises the electrode lead to the P-N junction formed in the opening 38 of the completed device.

Next, the reduced portion 32 formed by the grinding operation is treated to form an annular P-N junction 50 beneath the surface thereof coaxial with tthe cylinder and the opening 38. This operation may be achieved by wrapping around the surface of the portion 32 several turns of nickel or copper tubing 52 which have been coated with a layer 54 of one of the impurity substances mentioned above, preferably indium. If desired the tubing 52 may comprise a single turn conduit of elongated cross section. In addition, the ends 34 and 36 of the spool 31 are wrapped with tubes 56, 58 of copper or the like which are coated with a low melting point soldering material 55 such as tin. This assembly of indium coated tubing 52 and tin coated tubing 56 and 58 is heated to about 350° C. This heating operation causes the indium on the tubing 52 to form a bond with the tubing and to alloy with the body of the germanium crystal to form the annular P-N junction 50 including an annular rectifying barrier 60 and an annular layer of P-type conductivity material 62. The tin coated tubing is bonded to the germanium during this heating operation. If desired, the P-N junction 50 may be formed by heating a sheet of indium wrapped around the periphery of the body and then the tubing 52 may be bonded to the outer portion of the junction.

The various tubes 46, 52, 56 and 58 may be connected mechanically in parallel to a single feed line 57 from a coolant source (not shown) and to a single return line 59 to the source. In such an arrangement, the individual units of tubing are interconnected at their inlet ends by means of an insulating connection 61 and at their outlet ends by means of an insulating connection 63. If desired, the tubing 56 and 58, which constitutes the base electrode in the completed device, may be interconnected by an auxiliary piece of tubing (not shown) to form a single conduit for coolant. A device having a single coolant conduit including the tubes 56 and 58 and a connecting piece comprises a three element device or triode. A device of the type described above having separate tubes 56 and 58 comprises a four element device or tetrode. In any case, it is to be understood that the tubes 56 and 58 constitute one or more complete turns of piping surrounding the ends 31 and 34 of the germanium body 31. Tubes 46, 52, 56 and 58 may also be connected mechanically in series through insulating connecting pipes similar to the connecting portions 61 and 63.

To facilitate the application of signal and bias voltages to the various pieces of tubing to operate them as emitter, collector and base electrodes as desired, leads 64, 66, 68. 70 are connected to portions of the tubes 56, 52, 58, 46 respectively. Thus, with the appropriate circuit connections made, the pipes 56 and 58 are operated as base electrodes and the tubes 46 and 52 are operated as emitter and collector electrodes, or vice versa, as desired.

Finally the composite device may be potted in an insulating protective material such as Araldite with the ends of the various tubes projecting from the resin matrix.

The principles embodied in the device shown in Fig. 5 may also be applied to the preparation of a junction type rectifier. Such a device is shown in Fig. 7 wherein a body of semi-conductor material 72, for example germanium, which may be in the shape of a spool or may have any other desired shape, is provided with a central axial opening 74, a P-N junction 75 coaxial with and adjacent to the opening and a copper tube 76 inserted in the opening according to the method outlined above with respect to Figs. 5 and 6. If desired, the P-N junction may be formed beneath the outer surface of the body 72 rather than beneath the surface of the opening 74. A coil of tubing or a single flattened conduit 78 which is coated with tin 79 or the like is bonded in ohmic contact to the main body of the device as shown. The conduit 78 and tube 76 are connected to a source of coolant (not shown). As described above with reference to Fig. 5, each member may be connected directly to the source or they may be connected through insulating links to a single feed line and return line which are connected to the source.

The foregoing arrangement provides a comparatively simple and efficient method of manufacturing a junction type transistor and for cooling such a transistor whereby improved high power operation is achieved. In addition, since one of the P-N junctions is formed in a recessed portion of the germanium body, both junctions may be positioned with a small spacing between them. This close spacing of the junctions provides improved charge collection with resultant improved high frequency performance of the transistor.

What is claimed is:

1. A semiconductor device comprising a body of semiconductor material of one type of conductivity, a plurality of zones of different conductivity type in said body, heat radiating means in heat transmitting relationship with at least one of said zones, and forced fluid cooling means connected to said heat radiating means.

2. A semiconductor device comprising a body of semiconductor material, a plurality of P-N junctions in said body, heat radiating means in heat transmitting relationship with said junctions and fluid cooling means connected to said heat radiating means.

3. A semiconductor device comprising a body of semiconductor material, a plurality of P-N junctions in said body, said junctions including a region of P-type conductivity material and a region of N-type conductivity material separated by a rectifying barrier, heat radiating means in heat transmitting relationship with said body and said junctions in the vicinity of the rectifying barriers associated with said junctions, and fluid cooling means connected to said heat radiating means.

4. A semiconductor device including a body of semiconductor material and alternating annular zones of opposite type conductivity material, said annular zones being concentric with each other and extending the length of said body.

5. A semiconductor device including a cylindrical body of semiconductor material having a central longitudinal opening extending therethrough, and alternating annular zones of opposite type conductivity material, said annular zones being concentric with each other and with said opening and extending the length of said body.

6. A semiconductor device including a cylindrical body of semiconductor material having a central longitudinal opening extending therethrough, alternating annular zones of opposite type conductivity material, said annular zones being concentric with each other and with said opening and extending the length of said body, and an ohmic contact electrode mounted on said body.

7. The invention set forth in claim 6 and forced fluid cooling means mounted in heat transfer relation with separate ones of said zones.

8. A semiconductor device comprising a cylindrical body of semiconductor material of one type of conductivity having a peripheral recess and a central longitudinal opening, an annular layer of material of a different type of conductivity from said body present beneath said recess, a rectifying barrier separating said annular layer from said body, another annular layer of material of said different type of conductivity present in said body adjacent to said central opening, another rectifying barrier separating said other annular layer from said body and an electrode connected to said body.

9. The invention set forth in claim 8 and fluid cooling means mounted in heat transfer relationship with each of said annular layers and said electrode.

10. The invention set forth in claim 8 and fluid carrying tubing mounted in heat transfer relationship with each of said annular layers and said electrode, said tubing being mechanically serially connected by insulating connecting means.

11. A semiconductor device comprising a cylindrical body of semiconductor material having a central longitudinal opening extending therethrough, an annular P-N junction formed in said body coaxial with said opening, an annular P-N junction formed in said body adjacent to the outer surface of said cylindrical body, and an electrode mounted on said body in operative relationship with said P-N junctions.

12. A semiconductor device comprising a cylindrical body of semiconductor material having a central longitudinal opening extending therethrough, an annular P-N junction formed in said body adjacent to said opening and coaxial therewith, an annular P-N junction formed in said body adjacent to the outer surface of said cylindrical body and coaxial therewith, an electrode mounted on said body in operative relationship with said P-N junctions, and fluid cooling means mounted in heat transfer relation with each of said P-N junctions and said electrode.

13. A semiconductor device comprising a cylindrical body of semiconductor material having a peripheral recess and a central longitudinal opening, an annular P-N junction formed in said body adjacent to said opening, an annular P-N junction formed in said body beneath said recess, an electrode mounted on said body in operative relationship with said P-N junctions, and tubing mounted in heat transfer relation with each of said P-N junctions and said electrode, said tubing being adapted to receive a cooling agent.

14. A semiconductor device comprising a cylinder of semiconductor material having a central longitudinal opening extending therethrough, an annular P-N junction formed in said cylinder coaxial with said opening, and an electrode connected in ohmic contact with said body.

15. The invention set forth in claim 14 and fluid cooling means connected in heat transfer relation with said P-N junction and said body.

16. The method of forming a semiconductor device from a cylindrical semiconductor body comprising the steps of forming a central longitudinal opening in said body, forming a P-N junction adjacent to said opening and coaxial therewith, forming an annular P-N junction adjacent to the periphery of said cylinder, and connecting an electrode in ohmic contact with said body.

17. The method of forming a semiconductor device from a cylindrical semiconductor body comprising the steps of positioning a quantity of P-N junction forming impurity material on one end of said body, heating said material and forcing said material through said body to form a central longitudinal opening and alloying said material with said body radially from said opening to form an annular P-N junction adjacent thereto, and forming an annular P-N junction adjacent to the outer periphery of said body.

18. A semiconductor device including a cylindrical body of semiconductor material of one type of conductivity having annular zones of opposite type conductivity material, said annular zones being coaxial with each other and with said body, and an ohmic contact electrode connected to said body.

References Cited in the file of this patent

UNITED STATES PATENTS

| | | |
|---|---|---|
| 1,797,587 | Peter | Mar. 24, 1931 |
| 2,143,919 | Kotterman | Jan. 17, 1939 |
| 2,162,740 | Mirick | June 20, 1939 |
| 2,179,293 | Hein | Nov. 7, 1939 |
| 2,189,617 | Siebert et al. | Feb. 6, 1940 |
| 2,502,479 | Pearson et al. | Apr. 4, 1950 |
| 2,644,852 | Dunlap | July 7, 1953 |